(12) United States Patent
Taneda et al.

(10) Patent No.: US 12,057,384 B2
(45) Date of Patent: Aug. 6, 2024

(54) WIRING SUBSTRATE AND SEMICONDUCTOR DEVICE

(71) Applicant: SHINKO ELECTRIC INDUSTRIES CO., LTD., Nagano-ken (JP)

(72) Inventors: Hiroshi Taneda, Nagano (JP); Kei Imafuji, Nagano (JP); Yoshiki Akiyama, Nagano (JP); Kensuke Uchida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 211 days.

(21) Appl. No.: 17/526,089

(22) Filed: Nov. 15, 2021

(65) Prior Publication Data
US 2022/0157697 A1 May 19, 2022

(30) Foreign Application Priority Data
Nov. 16, 2020 (JP) ................................. 2020-190401

(51) Int. Cl.
*H01L 23/498* (2006.01)
(52) U.S. Cl.
CPC .... *H01L 23/4985* (2013.01); *H01L 23/49822* (2013.01); *H01L 23/49833* (2013.01)
(58) Field of Classification Search
CPC ........... H01L 23/4985; H01L 23/49822; H01L 23/49833; H01L 2224/16225; H01L 23/5383; H01L 23/5387; H05K 3/4682; H05K 3/4691; H05K 2201/055
See application file for complete search history.

(56) References Cited

U.S. PATENT DOCUMENTS

| | | | | |
|---|---|---|---|---|
| 5,408,052 A | * | 4/1995 | Inaba | H05K 3/4092 174/254 |
| 5,854,534 A | * | 12/1998 | Beilin | H01L 23/49827 257/E23.067 |
| 2009/0151988 A1 | * | 6/2009 | Lee | H05K 1/028 29/829 |

(Continued)

FOREIGN PATENT DOCUMENTS

| | | |
|---|---|---|
| JP | 2007096131 A | 4/2007 |
| JP | 2015162626 A | 9/2015 |
| JP | 2000114728 A | 4/2021 |

OTHER PUBLICATIONS

Jang et al., ("Residual Stress and Mechanical Properties of Polyimide Thin Films") (Year: 2009).*

(Continued)

*Primary Examiner* — Syed I Gheyas
(74) *Attorney, Agent, or Firm* — Tarolli, Sundheim, Covell & Tummino LLP

(57) ABSTRACT

A wiring substrate includes a bendable portion including one or more wiring layers and insulation layers that are alternately stacked. The insulation layers of the bendable portion include a first insulation layer and a second insulation layer. The first insulation layer is located at an inner bent position of the bendable portion when the bendable portion is bent. The second insulation layer is located at an outer bent position of the bendable portion relative to the first insulation layer when the bendable portion is bent. The first insulation layer has a higher elastic modulus than the second insulation layer.

8 Claims, 13 Drawing Sheets

(56) References Cited

U.S. PATENT DOCUMENTS

| | | | | |
|---|---|---|---|---|
| 2011/0132643 | A1* | 6/2011 | Hattori | H05K 1/09 |
| | | | | 174/254 |
| 2011/0247863 | A1* | 10/2011 | Watanabe | H05K 3/1216 |
| | | | | 29/829 |
| 2016/0066440 | A1* | 3/2016 | Choi | G06F 1/1601 |
| | | | | 361/679.3 |
| 2016/0181181 | A1* | 6/2016 | Su | H01L 23/4985 |
| | | | | 174/254 |
| 2019/0198411 | A1* | 6/2019 | Horikawa | H01L 23/5387 |
| 2019/0245164 | A1* | 8/2019 | Zou | G09G 3/3225 |
| 2020/0105657 | A1* | 4/2020 | Lee | H01L 23/4985 |
| 2021/0183840 | A1* | 6/2021 | Wang | H10K 71/00 |
| 2021/0329777 | A1* | 10/2021 | Min | H01Q 9/0407 |
| 2021/0399408 | A1* | 12/2021 | Min | H01Q 1/427 |

OTHER PUBLICATIONS

Hine et al., ("Hot compaction of polyethylene naphthalate") (Year: 2004).*

Hashemi et al., ("Morphology development and mechanical properties of unsaturated polyester resin containing nanodiamonds") (Year: 2017).*

JP Office Action for corresponding JP Patent Application No. 2020-190401, dated Mar. 5, 2024, 6 pgs.

* cited by examiner

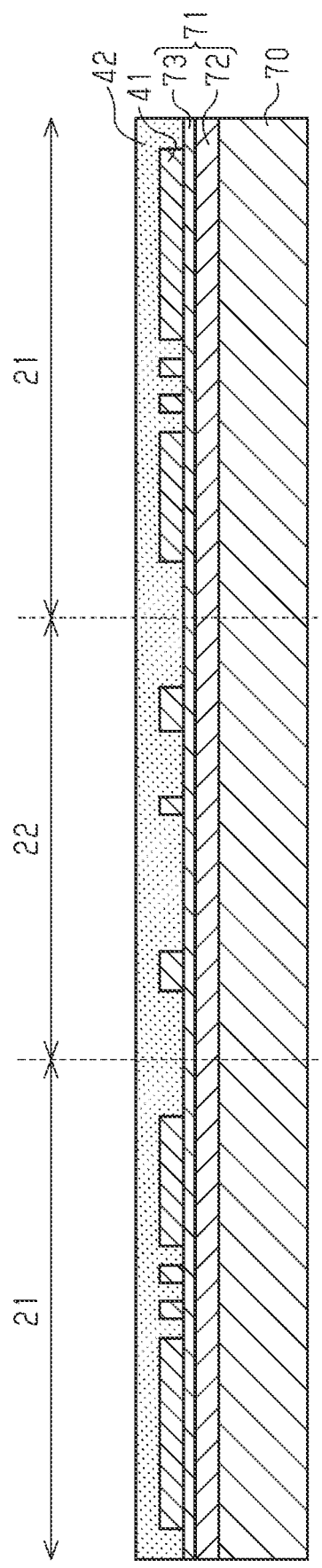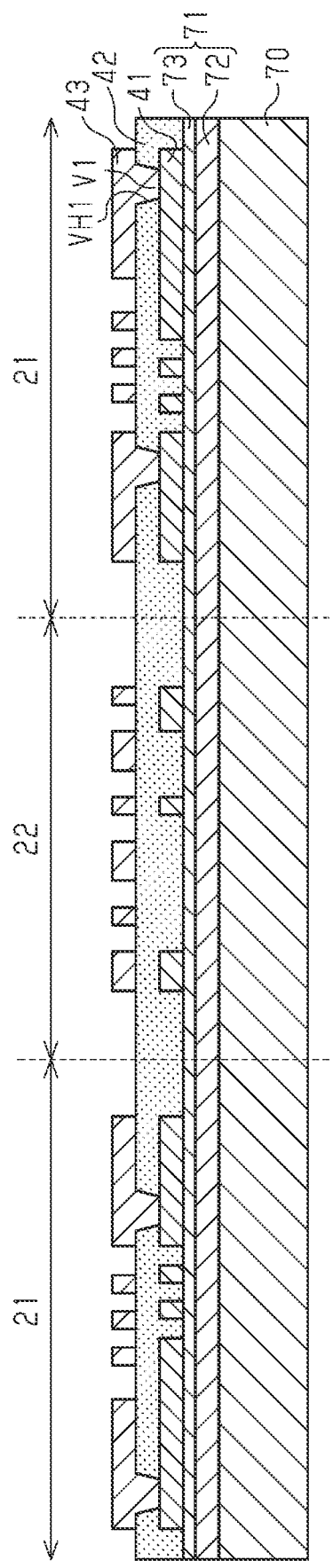

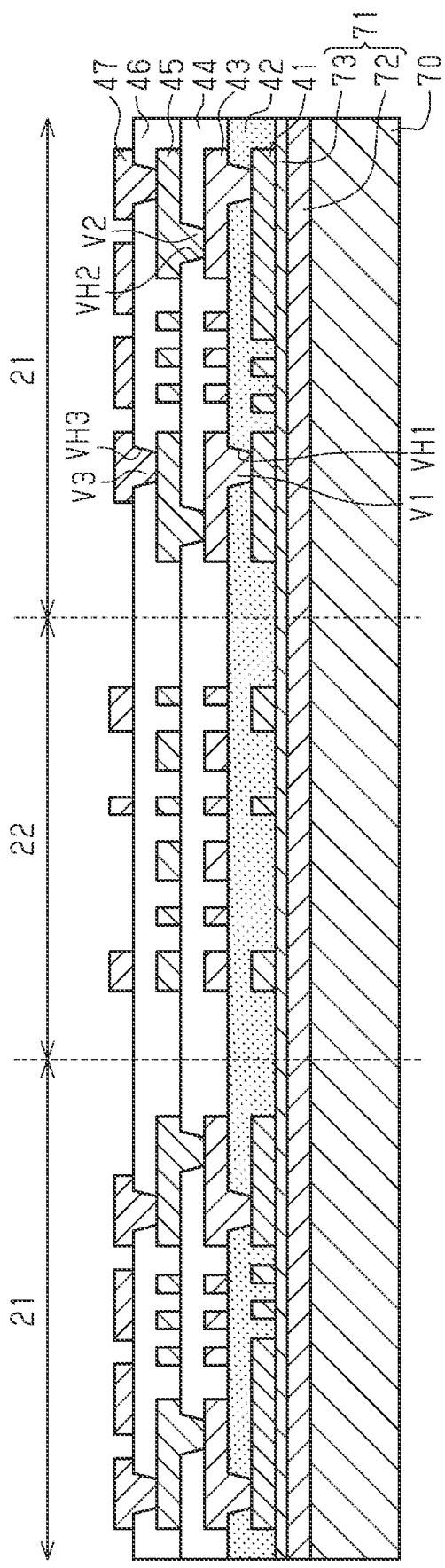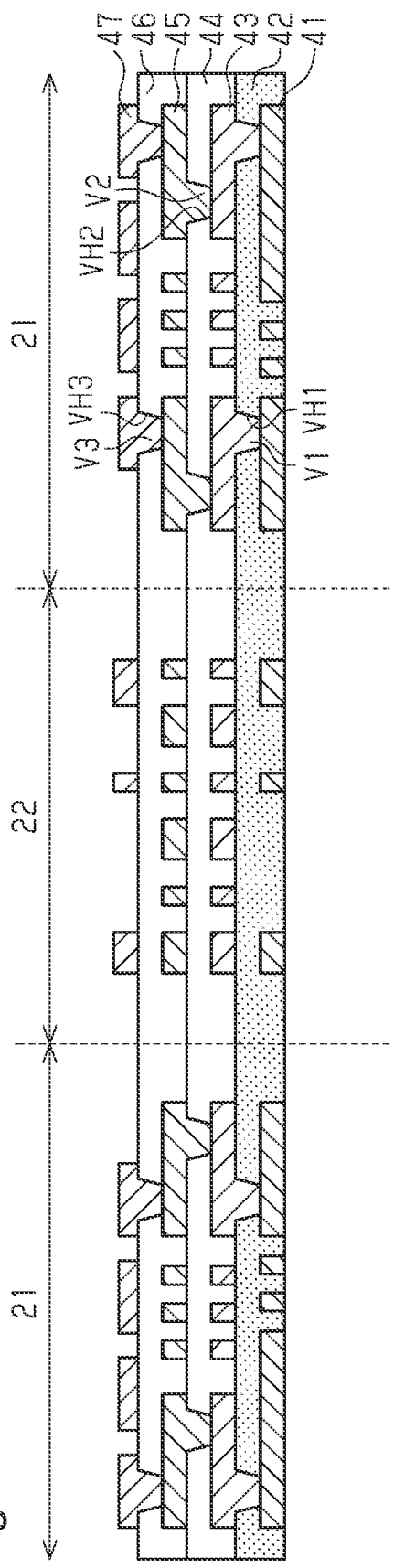

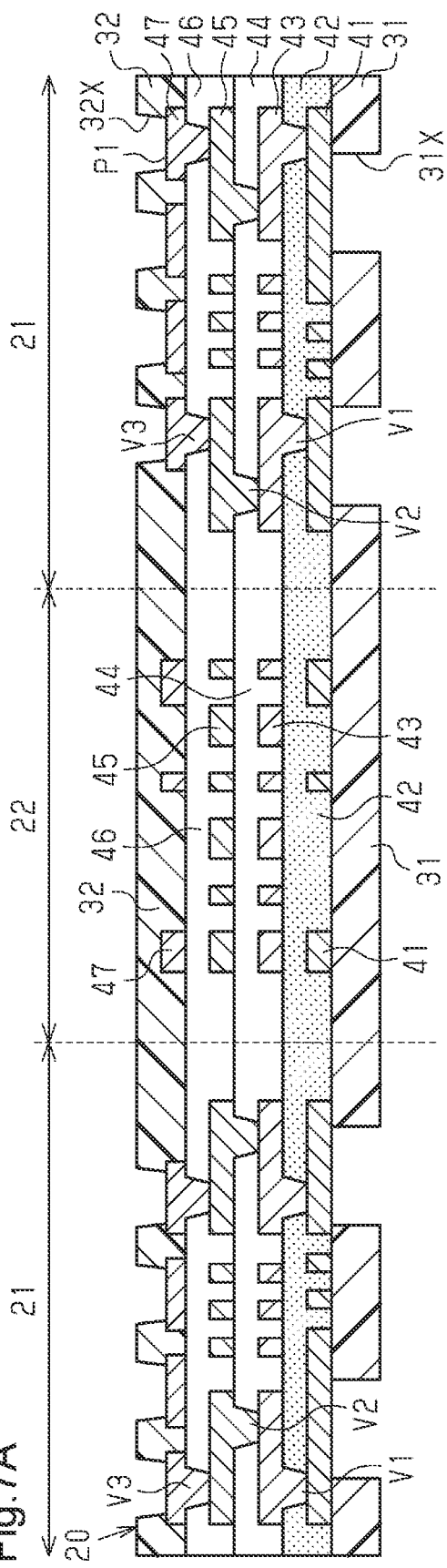
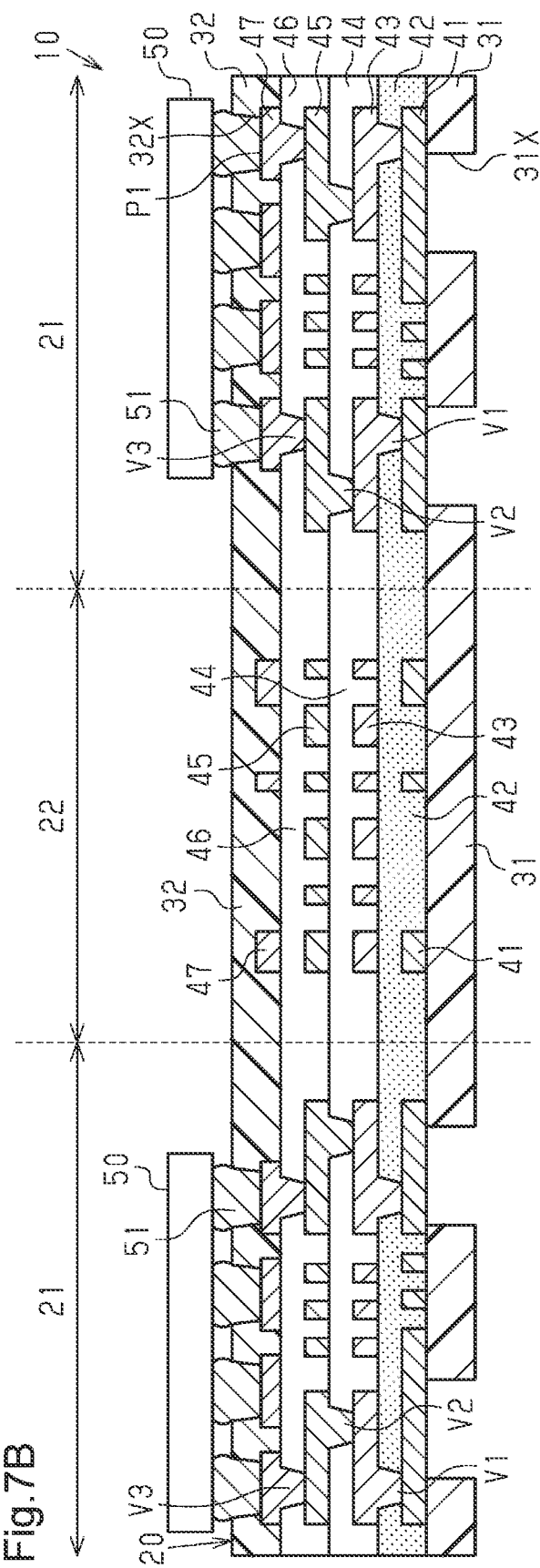

Fig.13

|  | 1st Example | 2nd Example | 1st Comparative Example | 2nd Comparative Example |
|---|---|---|---|---|
| Insulation Layer 46A | Resin B | Resin B | Resin A | Resin B |
| Insulation Layer 44A | Resin B | Resin A | Resin A | Resin B |
| Insulation Layer 42A | Resin A | Resin A | Resin A | Resin B |
| Stress | ◎ | ○ | △ | × |
| Flexural Modulus | ◎ | ○ | × | ◎ |

US 12,057,384 B2

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2020-190401, filed on Nov. 16, 2020, the entire contents of which are incorporated herein by reference.

FIELD

The present disclosure relates to a wiring substrate and a semiconductor device.

BACKGROUND

A known wiring substrate is used in an electronic device such as a wearable terminal. Japanese Laid-Open Patent Publication No. 2000-114728 discloses this type of wiring substrate. The wiring substrate may be bent and used.

SUMMARY

When a wiring substrate is bent and used, stress is produced in the bent part. The stress is likely to break or deform wiring layers and insulation layers located in the bent part. Therefore, there is a need for further improvement in the bending reliability of the bent part.

An embodiment of a wiring substrate includes a bendable portion including one or more wiring layers and insulation layers that are alternately stacked. The insulation layers of the bendable portion include a first insulation layer and a second insulation layer. The first insulation layer is located at an inner bent position of the bendable portion when the bendable portion is bent. The second insulation layer is located at an outer bent position of the bendable portion relative to the first insulation layer when the bendable portion is bent. The first insulation layer has a higher elastic modulus than the second insulation layer.

BRIEF DESCRIPTION OF THE DRAWINGS

The embodiments, together with objects and advantages thereof, may best be understood by reference to the following description of the presently preferred embodiments together with the accompanying drawings in which:

FIGS. 4A, 4B, 5A, 5B, 6A, 6B, and 7A are schematic cross-sectional views illustrating a method for manufacturing the wiring substrate illustrated in FIG. 1;

FIG. 7B is a schematic cross-sectional view illustrating a method for manufacturing the semiconductor device illustrated in FIG. 1 following the step of FIG. 7A;

FIG. 13 is a table of simulation results.

DESCRIPTION OF THE EMBODIMENTS

Figure 1:
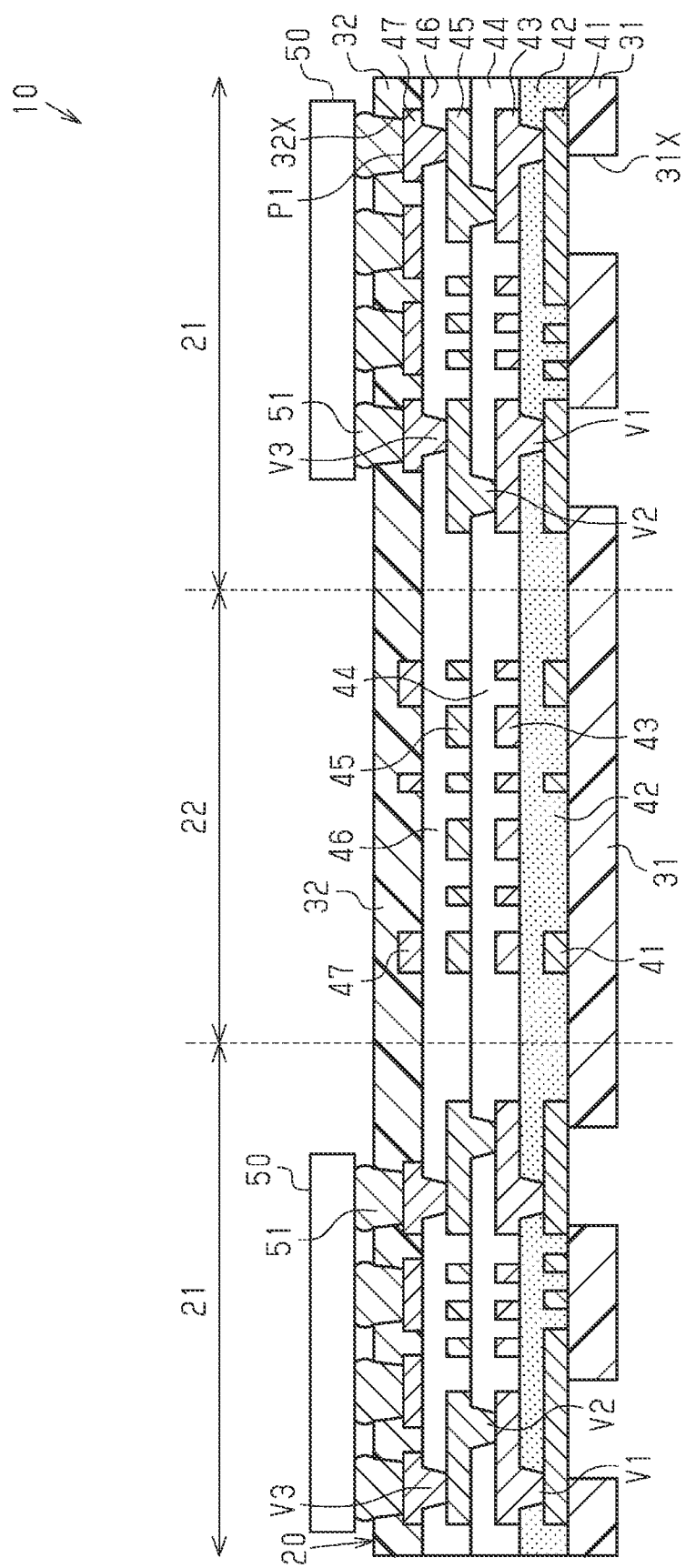
FIG. 1 is a schematic cross-sectional view (cross-sectional view taken along line 1-1 in FIG. 2) illustrating an embodiment of a semiconductor device including a wiring substrate.

Various embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. The terms "parallel" and "orthogonal" used in this specification are not limited to exactly parallel and exactly orthogonal, and include generally parallel and generally orthogonal within the scope in which the advantages of each embodiment are obtained. In this specification, the frame of reference for "the vertical direction" and "the sideward direction" is each drawing positioned so that the reference characters are properly read.

Structure of Semiconductor Device 10

Figure 2:
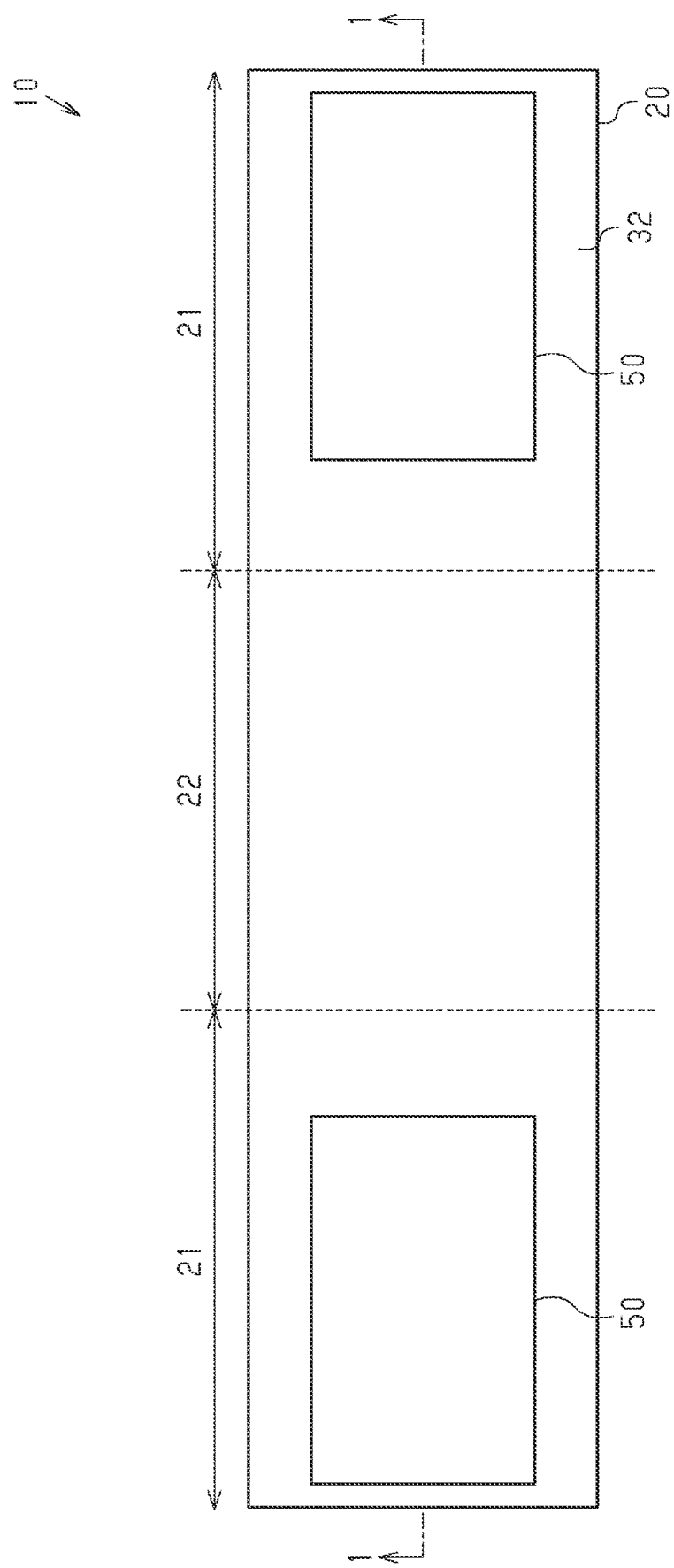
FIG. 2 is a schematic plan view of the semiconductor device illustrated in FIG. 1.

As illustrated in FIGS. 1 and 2, a semiconductor device 10 includes a wiring substrate 20 and one or more electronic components 50 mounted on the wiring substrate 20. Each electronic component 50 may be, for example, a semiconductor element, a chip component (e.g., chip capacitor, chip resistor, or chip inductor), or a crystal oscillator. The semiconductor element may be, for example, a logic chip such as a central processing unit (CPU) chip, a micro processing unit (MPU) chip, or a graphics processing unit (GPU) chip. The semiconductor element may be, for example, a memory chip such as a dynamic random access memory (DRAM) chip, a static random access memory (SRAM) chip, or a flash memory chip.

The wiring substrate 20 is a flexible substrate. Thus, the wiring substrate 20 is bendable or flexible.

Structure of Wiring Substrate 20

The wiring substrate 20 includes a mount portion 21 for the electronic component 50 and a bendable portion 22 configured to be bendable. In the form of the semiconductor device 10 including the wiring substrate 20, the electronic component 50 is mounted on the mount portion 21. In an example, mount portions 21 and bendable portions 22 are alternately arranged in the wiring substrate 20. In an example, the wiring substrate 20 includes two mount portions 21 and one bendable portion 22. In a longitudinal direction of the wiring substrate 20 (sideward direction in FIGS. 1 and 2), the first mount portion 21, the bendable portion 22, and the second mount portion 21 are arranged in this order. In other words, the two mount portions 21 are joined to opposite sides of the bendable portion 22. In an example, the electronic component 50 is not mounted on the bendable portion 22.

The bendable portion 22 may be designed to be bent in a given direction. The wiring substrate 20 includes one or more bendable portions 22, so that the wiring substrate 20 is readily bent at the bendable portions 22 in given directions.

Figure 3:
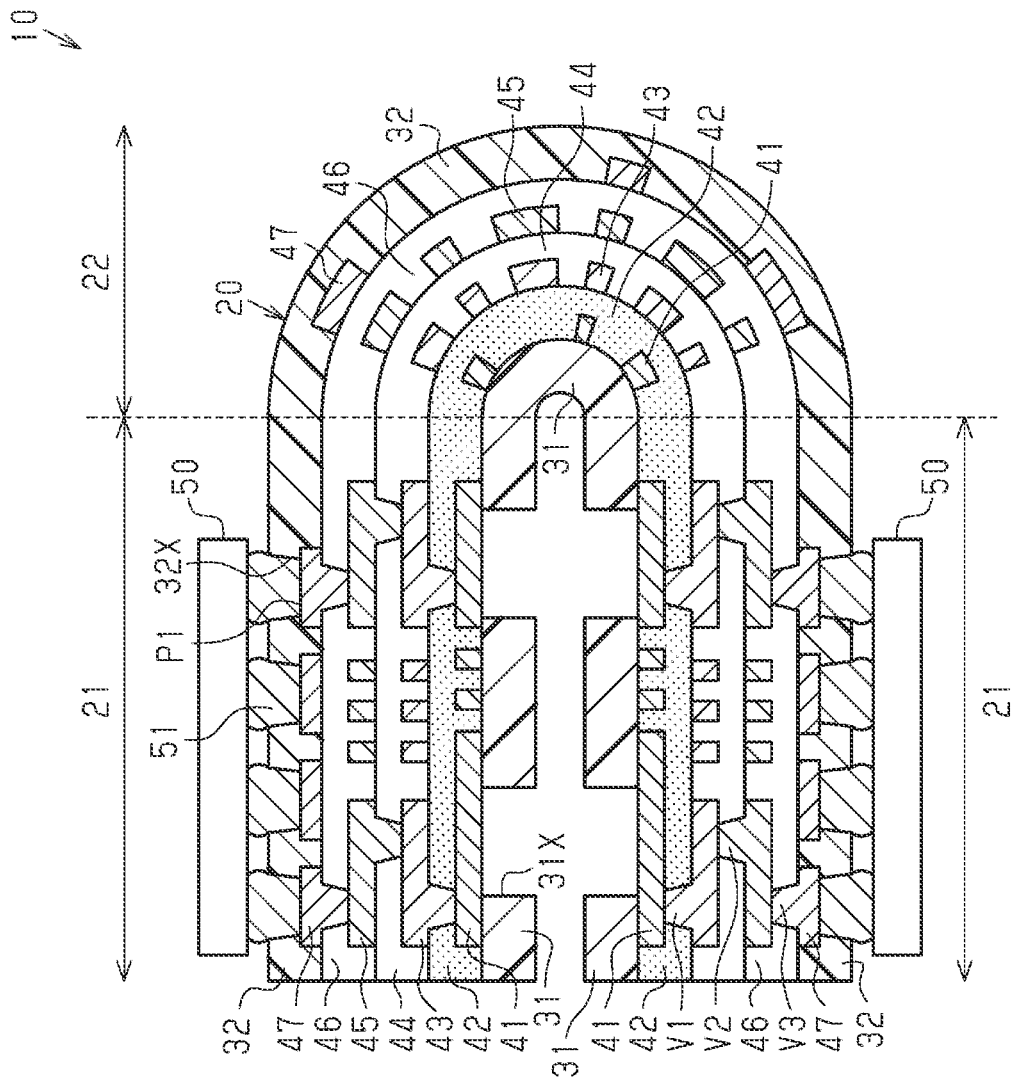
FIG. 3 is a schematic cross-sectional view of the semiconductor device illustrated in FIG. 1.

As illustrated in FIG. 3, the bendable portion 22 may be bent so that the two mount portions 21 disposed at opposite sides of the bendable portion 22 are arranged in a direction intersecting a planar direction of each mount portion 21. The planar direction of each mount portion 21 refers to a direction (sideward direction in FIG. 3) that is orthogonal to a stacking direction of the mount portion 21 (vertical direction in FIG. 3). In the example illustrated in FIG. 3, the bendable portion 22 is bent so that the two mount portions 21 are arranged next to each other in a direction (vertical direction in FIG. 3) that is orthogonal to the planar direction of each mount portion 21 (sideward direction in FIG. 3). In other words, the bendable portion 22 may be bent to be U-shaped so that the two mount portions 21 are faced to each other.

The wiring substrate 20 is a multilayer wiring substrate having a structure in which one or more wiring layers and insulation layers are alternately stacked.

Stacking Structure of Wiring Substrate 20

As illustrated in FIG. 1, the wiring substrate 20 has a structure in which a solder resist layer 31, a wiring layer 41, an insulation layer 42, a wiring layer 43, an insulation layer 44, a wiring layer 45, an insulation layer 46, a wiring layer 47, and a solder resist layer 32 are sequentially stacked. In the structure illustrated in FIG. 1, the wiring layer 41 is an example of a first wiring layer, the wiring layer 43 is an example of a second wiring layer, the wiring layer 45 is an example of a third wiring layer, and the wiring layer 47 is an example of a fourth wiring layer. Each of the solder resist layers 31 and 32 is an example of a protective insulation layer. In the example illustrated in FIG. 1, the wiring substrate 20 has a form of a coreless substrate that does not include a support base. The coreless substrate differs from a wiring substrate that is manufactured through a typical build-up process, that is, a wiring substrate formed by sequentially stacking a given number of build-up layers on one surface or both surfaces of a core substrate used as the support base.

In this specification, to simplify the description, the position of the solder resist layer 31 in the stacking direction of the wiring substrate 20 is referred to as the lower side of the wiring substrate 20, and the position of the solder resist layer 32 in the stacking direction of the wiring substrate 20 is referred to as the upper side of the wiring substrate 20. In addition, a surface of each member located at the lower side of the wiring substrate 20 is referred to as a lower surface. Another surface of each member located at the upper side of the wiring substrate 20 is referred to as an upper surface. However, the wiring substrate 20 may be inverted and used or may be used at any angle.

As illustrated in FIG. 3, when the bendable portion 22 is bent in a given direction, the solder resist layer 31 of the bendable portion 22 is located at an inner bent position of the bendable portion 22, and the solder resist layer 32 of the bendable portion 22 is located at an outer bent position of the bendable portion 22. In this case, among the insulation layers 42, 44, and 46, the insulation layer 42 is located at an inner position of the bendable portion 22. In an example, the insulation layer 42 is located closest to the solder resist layer 31 among the insulation layers 42, 44, and 46. That is, the insulation layer 42 is located at the innermost bent position of the bendable portion 22 among the insulation layers 42, 44, and 46. In the structure illustrated in FIG. 3, the insulation layer 42 is an example of a first insulation layer. Among the insulation layers 42, 44, and 46, the insulation layer 46 is located at an outer position of the bendable portion 22 relative to the insulation layer 42. In an example, the insulation layer 46 is located closest to the solder resist layer 32 among the insulation layers 42, 44, and 46. That is, the insulation layer 46 is located at the outermost bent position of the bendable portion 22 among the insulation layers 42, 44, and 46. In the structure illustrated in FIG. 3, the insulation layer 46 is an example of a second insulation layer. The insulation layer 44 is an example of a third insulation layer.

The insulation layer 42 located at the inner bent position has a higher elastic modulus than the insulation layer 46 located at the outer bent position. In addition, for example, the insulation layer 42 may have a higher elastic modulus than the insulation layer 44. The insulation layer 44 may have, for example, the same elastic modulus as the insulation layer 46. In an example, the insulation layer 42 may have a higher elastic modulus than the insulation layers 44 and 46, which are located at outer bent positions relative to the insulation layer 42, while the insulation layer 44 and the insulation layer 46 may have the same elastic modulus.

The material of the insulation layer 42 may be an insulative resin having a higher elastic modulus than the material of the insulation layer 46. The material of the insulation layer 42 may be an insulative resin having a lower elastic modulus than the material of the wiring layer 41. The material of the insulation layer 42 may be, for example, a non-photosensitive insulative resin, the main component of which is a thermosetting resin such as an epoxy resin or a polyimide resin. The insulation layer 42 may include, for example, a filler such as silica or alumina.

The material of the insulation layers 44 and 46 may be, for example, a flexible insulative resin having a low elastic modulus. The material of the insulation layers 44 and 46 may be, for example, an insulative resin having a lower elastic modulus than the material of the insulation layer 42. The material of the insulation layers 44 and 46 may be, for example, a non-photosensitive insulative resin, the main component of which is a thermosetting resin such as an epoxy resin or a polyimide resin. The material of the insulation layers 44 and 46 may be, for example, an insulative resin, the main component of which is a photosensitive resin such as a phenol resin or a polyimide resin. The insulation layers 44 and 46 may include, for example, a filler such as silica or alumina. The material of the insulation layer 44 may be the same as or different from the material of the insulation layer 46.

The elastic modulus of the insulation layer 42 may be, for example, approximately 3 GPa to 20 GPa. The elastic modulus of the insulation layers 44 and 46 may be, for example, approximately 0.01 GPa to 0.2 GPa.

The thickness of the insulation layers 42, 44, and 46 may be, for example, approximately 20 μm to 45 μm. In this specification, the thickness of an insulation layer (or solder resist layer) that covers a wiring layer is defined as the thickness of the insulation layer (or solder resist layer) from the upper surface of the wiring layer to the upper surface of the insulation layer (or solder resist layer).

The material of the wiring layers 41, 43, 45, and 47 may be, for example, copper (Cu) or a copper alloy. The thickness of the wiring layers 41, 43, 45, and 47 may be, for example, approximately 10 μm to 20 μm. The line-and-space (L/S) of the wiring layers 41, 43, 45, and 47 may be, for example, approximately 10 μm/10 μm to 20 μm/20 μm. The line-and-space (L/S) indicates a wiring width (L) and an interval (S) between adjacent wirings.

As illustrated in FIG. 1, the wiring layer 41 is an outermost wiring layer (here, lowermost wiring layer) of the wiring substrate 20. The insulation layer 42, for example, covers the upper surface and side surfaces of the wiring layer 41 and exposes the lower surface of the wiring layer 41. The lower surface of the insulation layer 42 is, for example, flush with the lower surface of the wiring layer 41.

For example, the solder resist layer 31 is formed on the lower surface of the insulation layer 42. The solder resist layer 31 is formed on the lower surface of the insulation layer 42 and covers the lower surface of the wiring layer 41. The solder resist layer 31 is an outermost insulation layer (here, lowermost insulation layer) of the wiring substrate 20. The thickness of the solder resist layer 31 may be, for example, approximately 20 μm to 45 μm.

The material of the solder resist layer 31 may be, for example, an insulative resin, the main component of which is a photosensitive resin such as a phenol resin or a polyimide resin. The solder resist layer 31 may include, for example, a filler such as silica or alumina. The material of the solder resist layer 31 is not limited to an insulative resin, the main component of which is a photosensitive resin and may be, for example, an insulative resin, the main component of which is a thermosetting resin.

The solder resist layer 31 includes openings 31X extending through the solder resist layer 31 in the thickness-wise direction and partially exposing the lower surface of the wiring layer 41. A surface-processed layer is formed on the wiring layer 41 exposed in the bottom of the openings 31X where appropriate. Examples of the surface-processed layer include a gold (Au) layer, a nickel (Ni) layer/Au layer (metal layer in which an Ni layer is used as bottom layer, and an Au layer is formed on the Ni layer), and an Ni layer/palladium (Pd) layer/Au layer (metal layer in which an Ni layer is used as bottom layer, and the Ni layer, a Pd layer, and an Au layer are stacked in order). The Au layer is a metal layer formed from Au or an Au alloy. The Ni layer is a metal layer formed from Ni or an Ni alloy. The Pd layer is a metal layer formed from Pd or a Pd alloy. Each of the Ni layer, the Au layer, and the Pd layer may be, for example, an electroless plated metal layer formed through an electroless plating process. Another example of the surface-processed layer may be an organic solderability preservative (OSP) film formed on the wiring layer 41 exposed in the bottom of the openings 31X through an anti-oxidation process such as an OSP process. The OSP film may be a coating of an organic compound such as an azole compound or an imidazole compound.

The wiring layer 43 is formed on the upper surface of the insulation layer 42. The wiring layer 43 includes via wirings V1 extending through the insulation layer 42 in the thickness-wise direction. The wiring layer 43 is electrically connected to the wiring layer 41 by the via wirings V1. The wiring layer 43 is, for example, formed integrally with the via wirings V1. The via wirings V1 connect the wiring layers 41 and 43 in the thickness-wise direction (i.e., the stacking direction of the wiring substrate 20).

The insulation layer 44 is formed on the upper surface of the insulation layer 42 and covers the wiring layer 43. The wiring layer 45 is formed on the upper surface of the insulation layer 44. The wiring layer 45 includes via wirings V2 extending through the insulation layer 44 in the thickness-wise direction. The wiring layer 45 is electrically connected to the wiring layer 43 by the via wirings V2. The wiring layer 45 is, for example, formed integrally with the via wirings V2. The via wirings V2 connect the wiring layers 43 and 45 in the thickness-wise direction.

The insulation layer 46 is formed on the upper surface of the insulation layer 44 and covers the wiring layer 45. The wiring layer 47 is formed on the upper surface of the insulation layer 46. The wiring layer 47 includes via wirings V3 extending through the insulation layer 46 in the thickness-wise direction. The wiring layer 47 is electrically connected to the wiring layer 45 by the via wirings V3. The wiring layer 47 is, for example, formed integrally with the via wirings V3. The wiring layer 47 is an outermost wiring layer (here, uppermost wiring layer) of the wiring substrate 20. The via wirings V3 connect the wiring layers 45 and 47 in the thickness-wise direction.

Each of the via wirings V1, V2, and V3 is, for example, tapered so that the width is decreased from the upper side (side close to the solder resist layer 32) toward the lower side (side close to the solder resist layer 31) in FIG. 1. For example, each of the via wirings V1, V2, and V3 has the form of an inverted truncated cone so that the lower surface is smaller than the upper surface. The diameter of the upper surface of the via wirings V1, V2, and V3 may be, for example, approximately 20 μm to 70 μm.

The solder resist layer 32 is formed on the upper surface of the insulation layer 46 and covers the wiring layer 47. The solder resist layer 32 is an outermost insulation layer (here, uppermost insulation layer) of the wiring substrate 20. The solder resist layer 32 has, for example, a lower elastic modulus than the insulation layer 42. The solder resist layer 32 may have, for example, the same elastic modulus as the insulation layers 44 and 46 or a lower elastic modulus than the insulation layers 44 and 46.

The material of the solder resist layer 32 may be, for example, an insulative resin having a lower elastic modulus than the material of the insulation layer 42. The material of the solder resist layer 32 may be, for example, an insulative resin having the same or lower elastic modulus than the material of the insulation layers 44 and 46. The material of the solder resist layer 32 may be an insulative resin, the main component of which is a photosensitive resin such as a phenol resin or a polyimide resin. The solder resist layer 32 may include, for example, a filler such as silica or alumina. The material of the solder resist layer 32 is not limited to an insulative resin, the main component of which is a photosensitive resin and may be, for example, an insulative resin, the main component of which is a thermosetting resin. The material of the solder resist layer 32 does not necessarily have to have a superior flexibility. When the material of the solder resist layer 32 does not have a superior flexibility, for example, the solder resist layer 32 may be omitted from the bendable portion 22. When the solder resist layer 32 is omitted from the bendable portion 22, for example, the wiring layer 47 may be omitted from the bendable portion 22. The elastic modulus of the solder resist layer 32 may be, for example, approximately 0.001 GPa to 0.2 GPa. Then thickness of the solder resist layer 32 may be, for example, approximately 20 μm to 45 μm.

The solder resist layer 32 includes openings 32X extending through the solder resist layer 32 in the thickness-wise direction and partially exposing the upper surface of the wiring layer 47 as connection pads P1. The connection pads P1 are, for example, used as electronic component connection pads electrically connected to the electronic component 50.

A surface-processed layer is formed on the wiring layer 47 (i.e., the connection pads P1) exposed from the openings 32X where appropriate. Examples of the surface-processed layer include a metal layer such as an Au layer, an Ni layer/Au layer, or an Ni layer/Pd layer/Au layer or an OSP film.

The wiring layers 41, 43, 45, and 47 may be disposed in any of the mount portion 21 and the bendable portion 22. In an example, the wiring layers 41, 43, 45, and 47 are formed in both the mount portion 21 and the bendable portion 22. The wiring layers 41, 43, 45, and 47 disposed in the bendable portion 22 have an area such that the bendable portion 22 maintains a required flexibility. When the material of the wiring layers 41, 43, 45, and 47 is copper, the copper remaining rate in the wiring layers 41, 43, 45, and 47 of the bendable portion 22 may be set in any manner within a range allowing for continuity of the required flexibility. The copper remaining rate refers to a ratio of the area of a copper layer to the area of an insulation layer. The copper remaining rate of the wiring layers 41 and 47, which correspond to the outermost wiring layers of the bendable portion 22, is, for example, set to be lower than the copper remaining rate of the wiring layers 43 and 45, which are located inward from the wiring layers 41 and 47. For example, the area of the wiring layers 41 and 47 of the bendable portion 22 is set to be less than the area of the wiring layers 43 and 45 of the bendable portion 22. In other words, the area of the wiring layer 43 of the bendable portion 22 may be greater than the area of the wiring layer 41 of the bendable portion 22 and greater than the area of the wiring layer 47 of the bendable portion 22. Also, the area of the wiring layer 45 of the bendable portion 22 may be greater than the area of the wiring layer 41 of the bendable portion 22 and greater than the area of the wiring layer 47 of the bendable portion 22. The copper remaining rate of the wiring layers 41 and 47 may be set to, for example, approximately 10% to 20%. The copper remaining rate of the wiring layers 43 and 45 may be set to, for example, approximately 30% to 40%.

In the example illustrated in FIG. 1, the via wirings V1, V2, and V3 are disposed in only the mount portions 21. That is, the via wirings V1, V2, and V3 are not disposed in the bendable portion 22. As described above, the via wirings V1, V2, and V3 are not disposed in the bendable portion 22, which is assumed to be bent. The via wirings V1, V2, and V3 are disposed in only the mount portions 21, which are not assumed to be bent. This appropriately obviates defective electrical connection caused by separation of the via wirings V1, V2, and V3 when the bendable portion 22 is bent.

The electronic components 50 are flip-chip-mounted on the wiring substrate 20. The electronic components 50 are mounted on, for example, the side (upper side in FIG. 1) of the wiring substrate 20 where the solder resist layer 32 is disposed. In the example illustrated in FIG. 1, the electronic components 50 are not mounted on the side (lower side in FIG. 1) of the wiring substrate 20 where the solder resist layer 31 is disposed. In an example, solder 51 electrically connects the electronic components 50 to the connection pads P1 of the wiring substrate 20. Thus, the solder 51 electrically connects the electronic components 50 to the wiring layer 47 of the wiring substrate 20. The material of the solder 51 may be, for example, an alloy including Pb, an alloy of Sn and Cu, an alloy of Sn and Ag, or an alloy of Sn, Ag, and Cu.

Structure of Bent Semiconductor Device 10

The structure of a semiconductor device 10 when the bendable portion 22 is bent will now be described with reference to FIG. 3.

Among the mount portion 21 and the bendable portion 22 of the wiring substrate 20, for example, only the bendable portion 22 is bent. The bendable portion 22 is, for example, bent so that the two mount portions 21 are arranged in a direction (vertical direction in FIG. 3) intersecting the planar direction (sideward direction in FIG. 3) of each mount portion 21. In the example illustrated in FIG. 3, the bendable portion 22 is bent to be U-shaped so that the two mount portions 21 are faced to each other. That is, the bendable portion 22 is bent so that the wiring substrate 20 is folded approximately 180 degrees. The solder resist layer 32 (the insulation layer 46) of the bendable portion 22 is located at an outer bent position in a stacking direction of the bendable portion 22. The solder resist layer 31 (the insulation layer 42) of the bendable portion 22 is located at an inner bent position in the stacking direction of the bendable portion 22. The bendable portion 22 is, for example, curved as an arc or an ellipse. When the bendable portion 22 is bent, the stacking direction of the bendable portion 22 intersects the stacking direction of each mount portion 21. The radius of curvature of the bendable portion 22 may be, for example, approximately 0.2 mm to 0.5 mm.

In the wiring substrate 20, the solder resist layers 31 of the two mount portions 21 are faced to each other. The two mount portions 21 are arranged, for example, so that the planar directions of the two mount portions 21 extend parallel to each other.

In the semiconductor device 10, each electronic component 50 is mounted on the mount portion 21 near the solder resist layer 32. Thus, the two mount portions 21 are located between the electronic components 50 that are separated from each other in a direction (vertical direction in FIG. 3) in which the two mount portions 21 are arranged.

Operation of Wiring Substrate 20 and Semiconductor Device 10

When the bendable portion 22 is bent, compressive stress is produced at the inner bent position of the bendable portion 22, and tensile stress is produced at the outer bent position of the bendable portion 22. At this time, for example, if the compressive stress causes the structural body in the inner bent position to deform, for example, strain, the deformation causes tensile stress to locally concentrate on the structural body in the outer bent position. Consequently, in the structural body in the outer bent position, the wiring layers and the insulation layers may break at the location on which tensile stress concentrated.

In this regard, in the wiring substrate 20, the insulation layer 42 has a relatively high elastic modulus and is disposed at the inner bent position, where compressive stress is produced. In an example, the elastic modulus of the insulation layer 42 located at the inner bent position is set to be higher than the elastic modulus of the insulation layer 46 located at the outer bent position. This improves the resistance of the insulation layer 42 to compressive stress as compared to when the elastic modulus of the insulation layer 42 is low (for example, similar to the elastic modulus of the insulation layers 44 and 46). Thus, deformation, such as strain, of the insulation layer 42 caused by compressive stress is limited. Ultimately, deformation, such as strain, of the structural body located at the inner bent position of the bendable portion 22 caused by compressive stress is limited. In other words, the structural body at the inner bent position of the bendable portion 22 may be curved in a given bending direction to have a desired radius of curvature. As a result, tensile stress is evenly applied to the entire structural body located at the outer bent position of the bendable portion 22. Tensile stress is less likely to concentrate on a local part of the structural body located at the outer bent position. This appropriately limits breakage of the insulation layer 46 and the wiring layer 47, which are located at the outer bent positions.

Manufacturing Method of Wiring Substrate 20

A method for manufacturing the wiring substrate 20 will now be described with reference to FIGS. 4A to 7A. In the illustrated example of steps, a single wiring substrate 20 is manufactured on a support substrate, and then the support substrate is removed. Instead, a structural body including a plurality of wiring substrates 20 may be formed on a support substrate. Then, after the support substrate is removed, the structural body may be singulated into the wiring substrates 20. To facilitate understanding, portions that ultimately become elements of the wiring substrate 20 are indicated by reference characters used to denote the final elements.

Figure 4A:
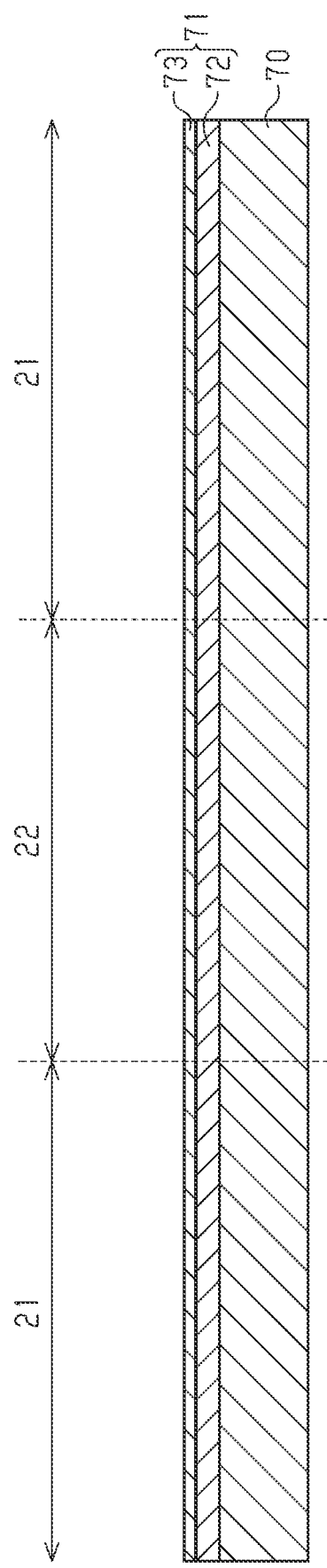

As illustrated in FIG. 4A, a structural body including a carrier-added metal foil 71 applied to the upper surface of a support substrate 70 is prepared. The support substrate 70 is, for example, a prepreg obtained by impregnating a reinforcement material such as a woven or non-woven cloth of glass, aramid, or liquid-crystal polymer (LCP) fiber with a thermosetting resin such as an epoxy resin or a polyimide resin. The carrier-added metal foil 71 includes a carrier layer 72 and an ultrathin metal foil 73 stacked on the upper surface of the carrier layer 72 with a release layer (not illustrated) located in between. The carrier layer 72 is provided as a support material that eases handling of the metal foil 73. The carrier layer 72 is, for example, a copper foil having a thickness of approximately 15 μm to 70 μm. The metal foil 73 is, for example, a copper foil having a thickness of approximately 0.5 μm to 10 μm.

The material of the carrier layer 72 is not limited to copper and may be a metal other than copper or an insulative material such as an insulative resin. The material of the metal foil 73 is not limited to copper and may be a metal other than copper.

Figure 4B:
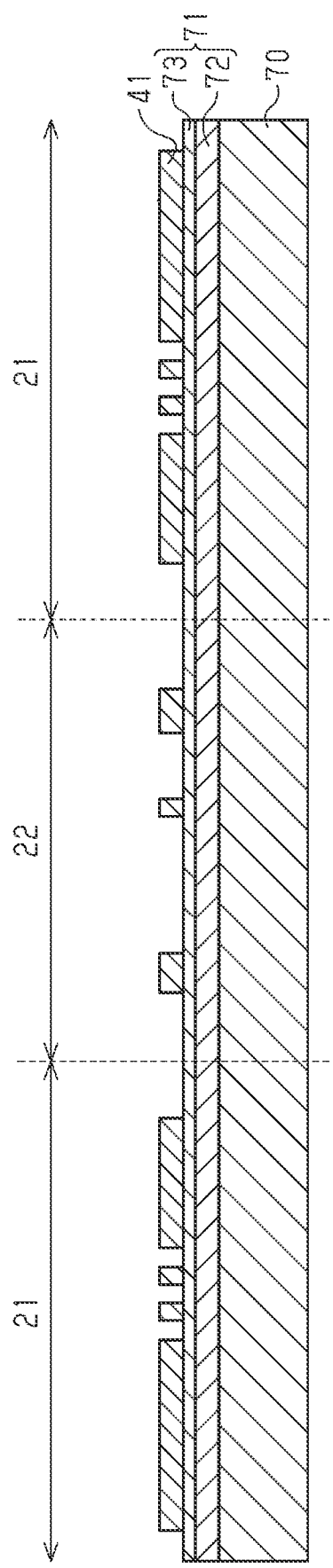

In the step illustrated in FIG. 4B, the wiring layer 41 is formed on the upper surface of the metal foil 73. The wiring layer 41 may be, for example, formed through a semi-additive process. In an example, a resist pattern (not illustrated) is formed on the upper surface of the metal foil 73. The resist pattern includes openings corresponding to the shape of the wiring layer 41. Electrolytic copper plating that uses the metal foil 73 as the power feeding layer is performed to deposit a coating of copper plating on the upper surface of the metal foil 73 exposed from the openings in the resist pattern. Subsequently, the resist pattern is removed, so that the wiring layer 41 is formed on the metal foil 73. In addition to the semi-additive process, various wiring forming processes such as a subtractive process may be used as the process for forming the wiring layer 41.

In the step illustrated in FIG. 5A, the insulation layer 42 is formed on the upper surface of the metal foil 73 to entirely cover the wiring layer 41. For example, when a resin film is used as the insulation layer 42, the upper surface of the metal foil 73 is laminated with the resin film. While the resin film is pressed, the resin film is heated at a curing temperature or higher (e.g., approximately 130° C. to 200° C.) so that the resin film is cured to form the insulation layer 42. The resin film may be, for example, a film of thermosetting resin including an epoxy resin as a main component. When a liquid or paste of insulative resin is used as the insulation layer 42, the liquid or paste of insulative resin is applied to the upper surface of the metal foil 73 through a spin coating process or the like. The applied insulative resin is heated at a curing temperature or higher so that the insulative resin is cured to form the insulation layer 42. The liquid or paste of insulative resin may be, for example, a thermosetting resin including an epoxy resin as a main component.

In the step illustrated in FIG. 5B, via holes VH1 are formed in the insulation layer 42 so that the via holes VH1 extend through the insulation layer 42 in the thickness-wise direction and partially expose the upper surface of the wiring layer 41. In an example, among the mount portion 21 and the bendable portion 22, the via holes VH1 are formed in only the mount portion 21. The via holes VH1 may be formed, for example, by laser drilling using a $CO_2$ laser or a YAG laser. When the insulation layer 42 is formed from a photosensitive resin, the desired via holes VH1 may be formed, for example, through photolithography.

When the via holes VH1 are formed by laser drilling, a desmear process is performed to remove resin smears from the upper surface of the wiring layer 41 exposed in the bottom of the via holes VH1. The desmear process may be performed, for example, using a permanganate process.

Then, for example, a semi-additive process is performed so that the via holes VH1 are filled with via conductors to form the via wirings V1 and so that the wiring layer 43 is formed on the upper surface of the insulation layer 42 and electrically connected to the wiring layer 41 by the via wirings V1.

In the step illustrated in FIG. 6A, in the same manner as the steps illustrated in FIGS. 5A and 5B, the insulation layer 44 is formed on the upper surface of the insulation layer 42. The insulation layer 44 includes via holes VH2 partially exposing the upper surface of the wiring layer 43. In the same manner as the step illustrated in FIG. 5B, the via holes VH2 are filled with via conductors to form the via wirings V2, and the wiring layer 45 is formed on the upper surface of the insulation layer 44 and electrically connected to the wiring layer 43 by the via wirings V2. In an example, among the mount portion 21 and the bendable portion 22, the via holes VH2 and the via wirings V2 are formed in only the mount portion 21.

In the same manner as the steps illustrated in FIGS. 5A and 5B, the insulation layer 46 is formed on the upper surface of the insulation layer 44. The insulation layer 46 includes via holes VH3 partially exposing the upper surface of the wiring layer 45. In the same manner as the step illustrated in FIG. 5B, the via holes VH3 are filled with via conductors to form the via wirings V3, and the wiring layer 47 is formed on the upper surface of the insulation layer 46 and electrically connected to the wiring layer 45 by the via wirings V3. In an example, among the mount portion 21 and the bendable portion 22, the via holes VH3 and the via wirings V3 are formed in only the mount portion 21.

The support substrate 70 and the carrier-added metal foil 71 (the carrier layer 72 and the metal foil 73) are removed. For example, the carrier layer 72 and the support substrate 70 are mechanically separated from the metal foil 73. Since the release layer (not illustrated) is arranged between the carrier layer 72 and the metal foil 73, adhesion force between the carrier layer 72 and the metal foil 73 is low. This facilitates separation of the carrier layer 72 and the support substrate 70 from the metal foil 73. The metal foil 73 is removed, for example, by etching. At this time, for example, to prevent the wiring layer 47 from being etched together with the metal foil 73, the wiring layer 47 is masked and then etching is performed. In the etching of the metal foil 73, an etch selectivity is selected so as not to remove the wiring layer 41. In this step, as illustrated in FIG. 6B, the lower surface of the wiring layer 41 and the lower surface of the insulation layer 42 are exposed to the exterior.

In the step illustrated in FIG. 7A, the solder resist layer 31 including the openings 31X is stacked on the lower surface of the insulation layer 42, and the solder resist layer 32 including the openings 32X is stacked on the upper surface of the insulation layer 46. The solder resist layers 31 and 32 may be formed, for example, by laminating a photosensitive solder resist film or applying a liquid solder resist and patterning the resist into a desired shape. As necessary, for example, a metal layer obtained by stacking an Ni layer and an Au layer in this order may be formed on the wiring layer 41 exposed from the openings 31X and the wiring layer 47 exposed from the openings 32X. The metal layer may be formed, for example, through an electroless plating process.

The manufacturing steps described above manufacture the wiring substrate 20 illustrated in FIG. 1.

Then, as illustrated in FIG. 7B, the electronic components 50 are mounted on the side (upper side in FIG. 7) of the wiring substrate 20 where the solder resist layer 32 is disposed. This manufactures the semiconductor device 10 illustrated in FIG. 1. The bendable portion 22 is bent in a given direction, so that the semiconductor device 10 illustrated in FIG. 3 is manufactured. The semiconductor device 10 may be inverted when used or may be arranged at any angle.

The embodiment has the advantages described below.

(1) The insulation layer 42 has a relatively high elastic modulus and is disposed at the inner bent position of the bendable portion 22, where compressive stress is produced. In an example, the elastic modulus of the insulation layer 42 located at the inner bent position is set to be higher than the elastic modulus of the insulation layer 46 located at the outer bent position. This improves the resistance of the insulation layer 42 to compressive stress as compared to when the elastic modulus of the insulation layer 42 is low (for example, similar to the elastic modulus of the insulation layers 44 and 46). Thus, deformation, such as strain, of the insulation layer 42 caused by compressive stress is limited. Ultimately, deformation, such as strain, of the structural body located at the inner bent position of the bendable portion 22 caused by compressive stress is limited. This limits local concentration of tensile stress on the structural body located at the outer bent position of the bendable portion 22. As a result, breakage of the insulation layer 46 and the wiring layer 47, which are located at the outer bent positions, is appropriately limited. This improves the bending reliability of the bent part (bendable portion 22).

(2) The insulation layer 46 has a relatively low elastic modulus and is disposed at the outer bent position of the bendable portion 22. Thus, the flexural modulus of the bendable portion 22 is decreased as compared to when the elastic modulus of the insulation layer 46 is relatively high (for example, similar to the elastic modulus of the insulation layer 42). This improves the flexibility of the bendable portion 22.

(3) The elastic modulus of the insulation layer 44, which is located between the insulation layer 42 and the insulation layer 46 in the stacking direction of the wiring substrate 20, is set to be lower than the elastic modulus of the insulation layer 42, which is located at the inner bent position. Thus, the flexural modulus of the bendable portion 22 is decreased as compared to when the elastic modulus of the insulation layer 44 is relatively high (for example, similar to the elastic modulus of the insulation layer 42). This improves the flexibility of the bendable portion 22.

(4) The area of the wiring layer 45 of the bendable portion 22 is greater than the area of the wiring layer 41 of the bendable portion 22 and greater than the area of the wiring layer 47 of the bendable portion 22. Also, the area of the wiring layer 43 of the bendable portion 22 is greater than the area of the wiring layer 41 of the bendable portion 22 and greater than the area of the wiring layer 47 of the bendable portion 22. For example, the copper remaining rate of the wiring layers 43 and 45 of the bendable portion 22 is set to be higher than the copper remaining rate of the wiring layers 41 and 47 of the bendable portion 22. That is, a high formation density is set to the wiring layers 43 and 45, which are located in a central part of the bendable portion 22 in the stacking direction of the wiring substrate 20 where application of stress such as compressive stress and tensile stress is relatively limited. In other words, a low formation density is set to the wiring layers 41 and 47, which are located in an outer part of the bendable portion 22 in the stacking direction of the wiring substrate 20 where stresses such as compressive stress and tensile stress are likely to be applied. Thus, deformation, such as breakage or strain, of the wiring layers 41 and 47 caused by bending stress is appropriately limited. In addition, since the formation density of the wiring layers 43 and 45 is high, desired wiring paths are formed using the wiring layers 43 and 45.

(5) The elastic modulus of the solder resist layer 32, which is stacked on the upper surface of the insulation layer 46 and covers the wiring layer 47, is set to be lower than the elastic modulus of the insulation layer 42 disposed at the inner bent position. That is, the elastic modulus of the solder resist layer 32, which is located at the outermost bent position of the bendable portion 22, is set to be lower than the elastic modulus of the insulation layer 42. Thus, the flexural modulus of the bendable portion 22 is decreased as compared to when the elastic modulus of the solder resist layer 32 is relatively high (for example, similar to the elastic modulus of the insulation layer 42). This improves the flexibility of the bendable portion 22.

It should be apparent to those skilled in the art that the foregoing embodiments may be implemented in many other specific forms without departing from the scope of this disclosure. Particularly, it should be understood that the foregoing embodiments may be implemented in the following forms.

The embodiment and the modified examples described below may be combined as long as the combined modified examples remain technically consistent with each other.

In the embodiment, the insulation layer 42 is located at the inner bent position and is formed from an insulative resin having a relatively high elastic modulus, and the insulation layers 44 and 46 are located at the outer bent positions relative to the insulation layer 42 and are formed from an insulative resin having a relatively low elastic modulus. However, the setting of the elastic modulus is not limited to that of the embodiment.

Figure 8:
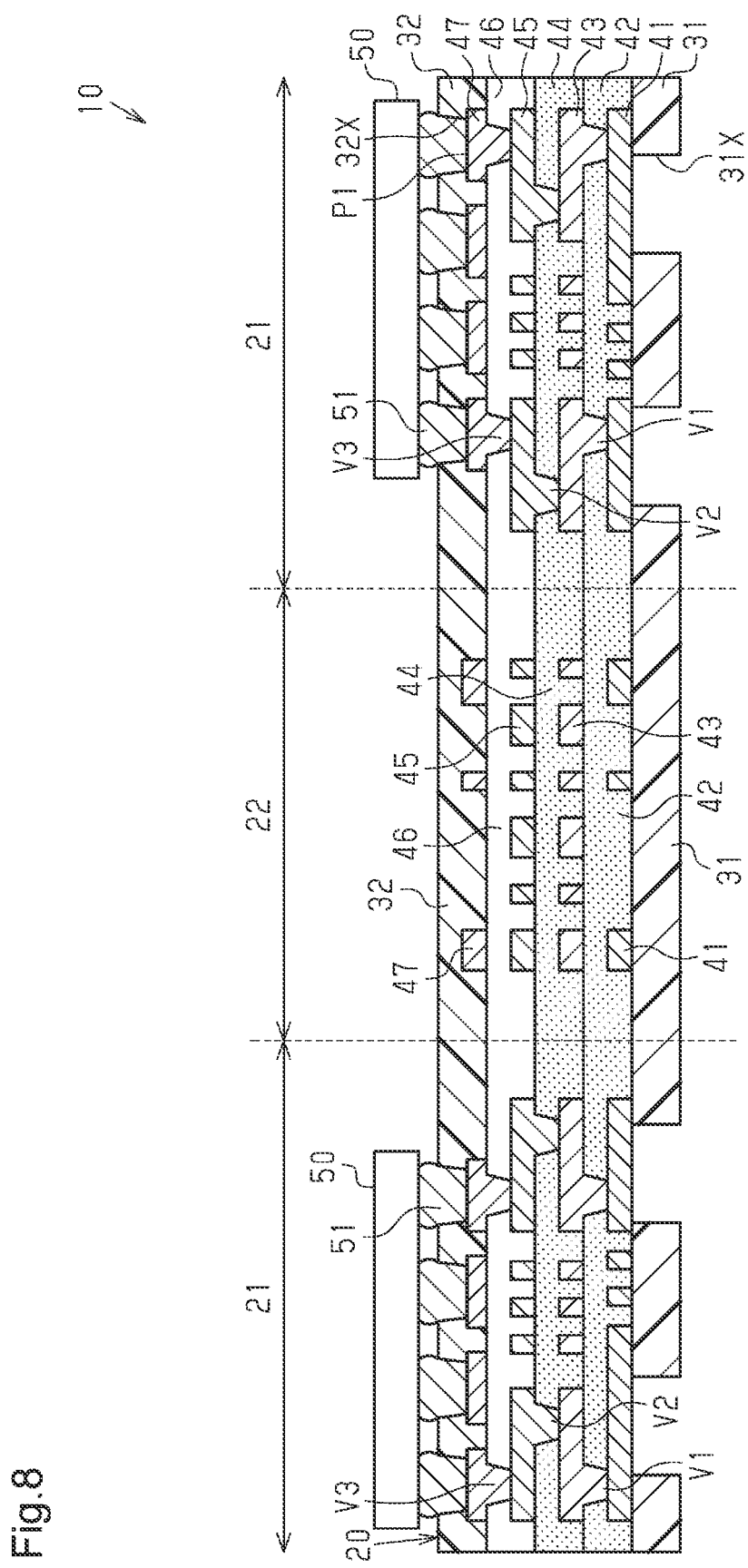
FIGS. 8, 9, 10, and 11 are schematic cross-sectional views illustrating various modified examples of semiconductor devices.

For example, as illustrated in FIG. 8, the insulation layers 42 and 44 may be formed from an insulative resin having a relatively high elastic modulus, and the insulation layer 46 may be formed from an insulative resin having a relatively low elastic modulus. For example, the insulation layer 44 and the insulation layer 42 may have the same elastic modulus. For example, the insulation layer 44 and the insulation layer 42 may be formed from the same material.

This structure also obtains the advantages (1), (2), (4), and (5) of the embodiment.

In the modified example illustrated in FIG. 8, the elastic modulus of the insulation layer 44 may differ from the elastic modulus of the insulation layer 42. For example, the elastic modulus of the insulation layer 44 may be set to be lower than the elastic modulus of the insulation layer 42 and higher than the elastic modulus of the insulation layer 46. In this case, the elastic moduli of the insulation layers 42, 44, and 46 decrease in a stepped manner from the inner bent position toward the outer bent position of the bendable portion 22.

In the embodiment, the mount portion 21 and the bendable portion 22 include the same number of wiring layers 41, 43, 45, and 47. However, the number of wiring layers disposed in the mount portion 21 and the bendable portion 22 is not particularly limited. For example, at least one of the wiring layers 41, 43, 45, and 47 may be omitted from the bendable portion 22. In this case, the number of wiring layers in the bendable portion 22 is less than the number of wiring layers in the mount portion 21. When the number of wiring layers in the bendable portion 22 is less than the number of wiring layers in the mount portion 21, the formation density of the wiring layers in the bendable portion 22 is decreased. Thus, a favorable flexibility is obtained.

Figure 9:
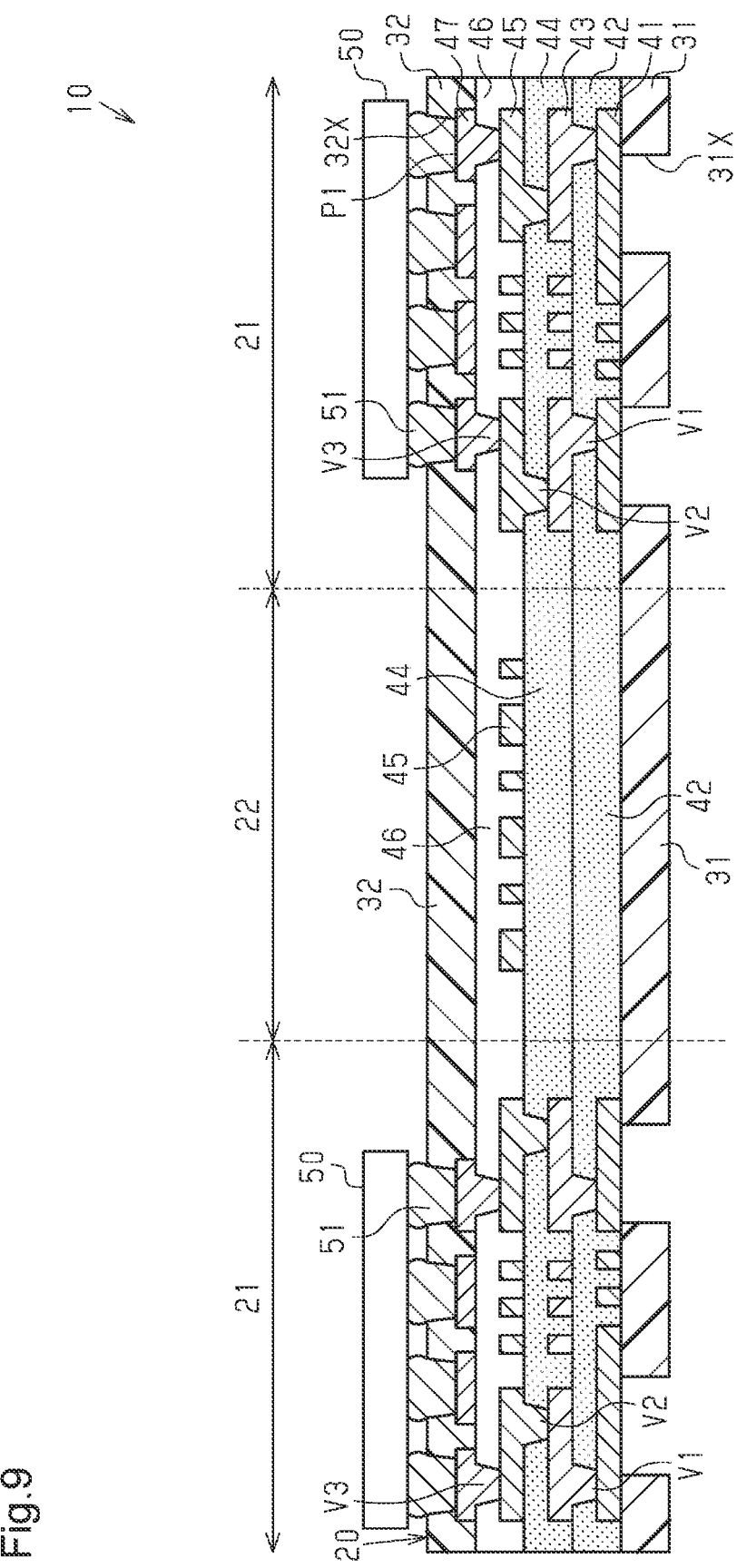

For example, as illustrated in FIG. 9, the wiring layers 41, 43, and 47 may be omitted from the bendable portion 22. That is, in this modified example, the wiring layers 41, 43, and 47 are not formed in the bendable portion 22. In other words, in the mount portion 21 and the bendable portion 22, the wiring layers 41, 43, and 47 are formed in only the mount portion 21. Among the wiring layers 41, 43, 45, and 47, only the wiring layer 45 is formed in the bendable portion 22. Therefore, the bendable portion 22 includes one wiring layer (the wiring layer 45), whereas the mount portion 21 includes four wiring layers (the wiring layers 41, 43, 45, and 47). In this structure, it is preferred that the insulation layer 44 that is in contact with the lower surface of the wiring layer 45 of the bendable portion 22, that is, the insulation layer 44 that is used as the base layer of the wiring layer 45, has a higher elastic modulus than the insulation layer 46, which is located at the outer bent position. When the insulation layer 44 is formed from an insulative resin having a relatively high elastic modulus, the resistance of the insulation layer 44 to, for example, compressive stress is improved. This limits strain of the insulation layer 44 caused by compressive stress, thereby appropriately limiting breakage and separation of the wiring layer 45, which is formed on the upper surface of the insulation layer 44.

In the modified example illustrated in FIG. 9, the bendable portion 22 includes only the wiring layer 45. However, the bendable portion 22 may include, for example, only the wiring layer 43.

In the embodiment, the electronic components 50 are mounted on the side (for example, in FIG. 1, upper side) of the wiring substrate 20 where the solder resist layer 32 is disposed. However, the mount position of the electronic components 50 is not particularly limited.

Figure 10:
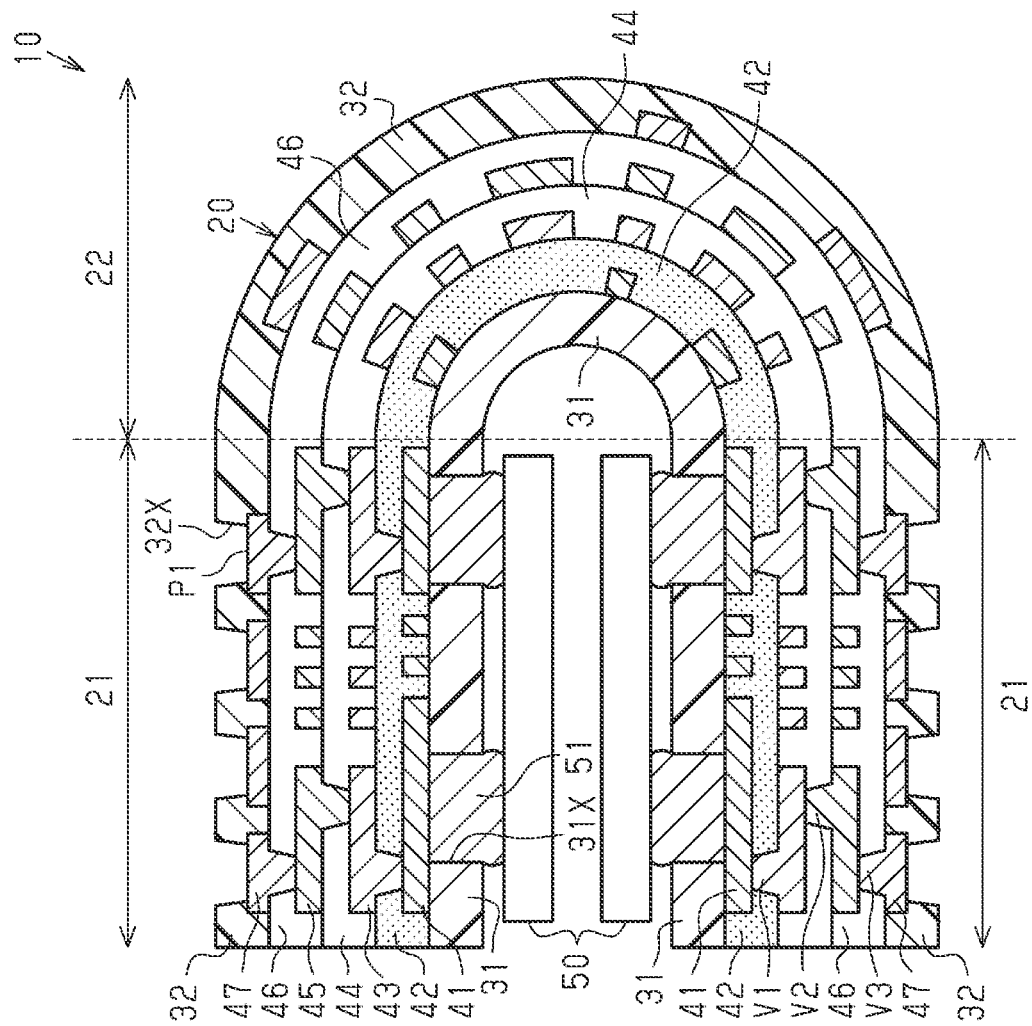

For example, as illustrated in FIG. 10, the electronic components 50 may be mounted on the side of the wiring substrate 20 where the solder resist layer 31 is disposed. In this case, the electronic components 50 are electrically connected to, for example, the wiring layer 41 exposed in the bottom of the openings 31X of the solder resist layer 31. In this modified example, when the bendable portion 22 is bent in a given direction, the electronic component 50 that is mounted on one mount portion 21 is faced to the electronic component 50 that is mounted on the other mount portion 21.

In the embodiment, the electronic components 50 may be mounted on both the side of the wiring substrate 20 where the solder resist layer 31 is disposed and the side of the wiring substrate 20 where the solder resist layer 32 is disposed.

In the embodiment, the wiring substrate 20 includes four wiring layers (wiring layers 41, 43, 45, and 47) and three insulation layers (insulation layers 42, 44, and 46). However, the number of wiring layers and the number of insulation layers are not particularly limited. The number of wiring layers in the wiring substrate 20 may be, for example, any one of one to three or five or more. The number of insulation layers in the wiring substrate 20 may be two or four or more.

Figure 11:
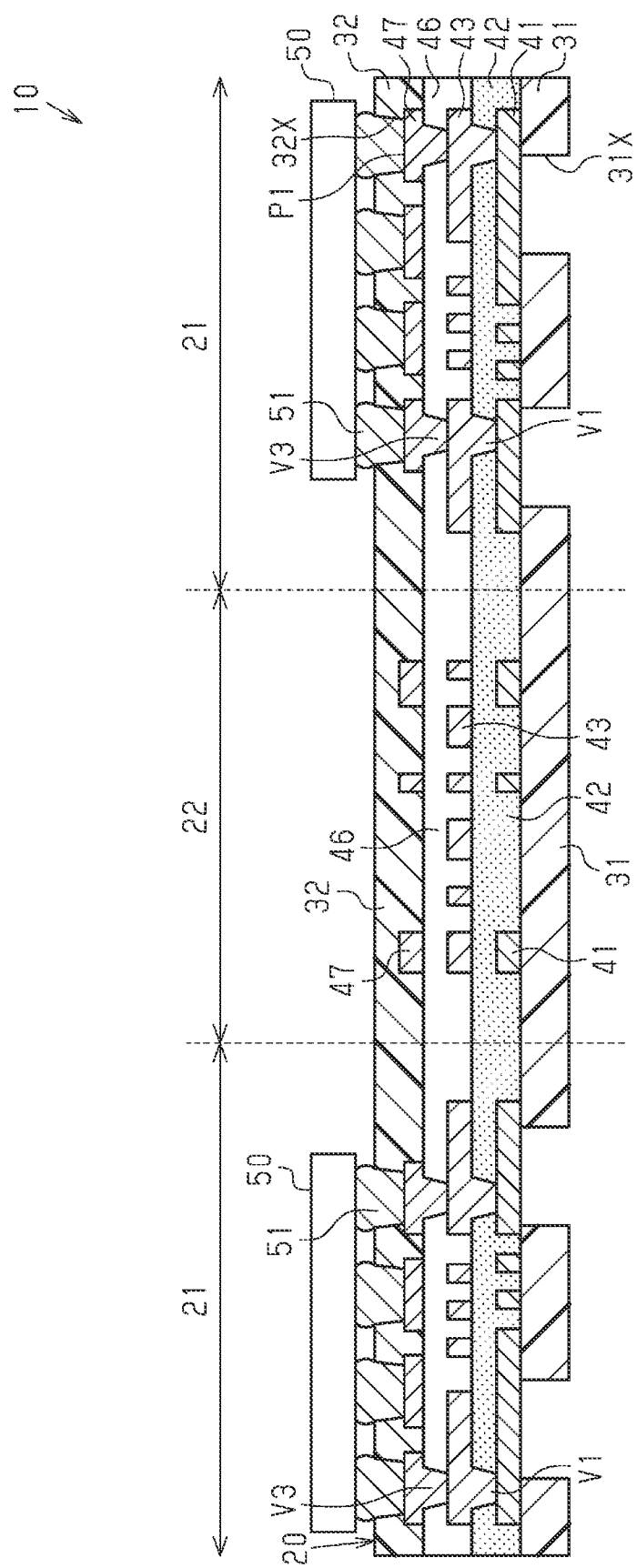

For example, as illustrated in FIG. 11, the wiring substrate 20 may include three wiring layers and two insulation layers. In this modified example, the solder resist layer 31, the wiring layer 41, the insulation layer 42, the wiring layer 43, the insulation layer 46, the wiring layer 47, and the solder resist layer 32 are sequentially stacked in the wiring substrate 20. The insulation layer 46 is stacked on the upper surface of the insulation layer 42 and covers the wiring layer 43. The wiring layer 47 is formed on the upper surface of the insulation layer 46. The wiring layer 47 is electrically connected to the wiring layer 43 by the via wirings V3 extending through the insulation layer 46 in the thicknesswise direction. Also, in this modified example, the insulation layer 42 located at the inner bent position has a higher elastic modulus than the insulation layer 46 located at the outer bent position. The wiring layer 43 of the bendable portion 22 is greater in area than the wiring layer 41 of the bendable portion 22 and greater in area than the wiring layer 47 of the bendable portion. In the structure illustrated in FIG. 11, the wiring layer 41 is an example of a first wiring layer, the wiring layer 43 is an example of a second wiring layer, and the wiring layer 47 is an example of a third wiring layer. The insulation layer 42 is an example of a first insulation layer and the insulation layer 46 is an example of a second insulation layer. Each of the solder resist layers 31 and 32 is an example of a protective insulation layer.

This structure also obtains the advantages (1), (2), (4), and (5) of the embodiment.

In the embodiment, the bendable portion 22 does not include the via wirings V1 to V3. However, the bendable portion 22 may include, for example, the via wirings V1 to V3.

In the embodiment, the solder resist layers 31 and 32 are illustrated as examples of protective insulation layers corresponding to the outermost insulation layers of the wiring substrate 20. Instead, the protective insulation layers may be formed from various types of photosensitive insulative resins.

In the embodiment, the solder resist layer 31 may be omitted.

In the embodiment, the solder resist layer 32 may be omitted.

In the embodiment, the bendable portion 22 is bent to be U-shaped so that the two mount portions 21 are faced to each other. However, the bending angle of the bendable portion 22 is not particularly limited. For example, the bendable portion 22 may be bent so that the planar directions of the two mount portions 21 extend orthogonal to each other. In this case, the bendable portion 22 is bent so that, for example, the wiring substrate 20 is L-shaped.

In the embodiment, the mount portion 21 is an adjacent portion located adjacent to the bendable portion 22. However, the adjacent portion is not limited to the mount portion 21. For example, at least one of the two adjacent portions located on opposite sides of the bendable portion 22 may be set to be a region other than the mount portion 21, that is, a region where the electronic components 50 is not mounted.

In the embodiment, the wiring substrate 20 includes one bendable portion 22. Instead, the wiring substrate 20 may include for example, two or more bendable portions 22.

In the embodiment, the wiring substrate 20 is a coreless substrate. However, there is no limitation to such a structure.

For example, the wiring substrate 20 may be a wiring substrate including a core substrate.

Simulation

Regarding a wiring substrate having the same layer structure as the wiring substrate 20 illustrated in FIG. 1, that is, including four wiring layers and three insulation layers, the flexural modulus of the wiring substrate and stress produced when the wiring substrate is bent to be U-shaped were simulated. The simulation was executed using an analysis tool (ABAQUS 2018HF15) and a 3D model and a quarter symmetry model.

Simulation Condition

Figure 12A:
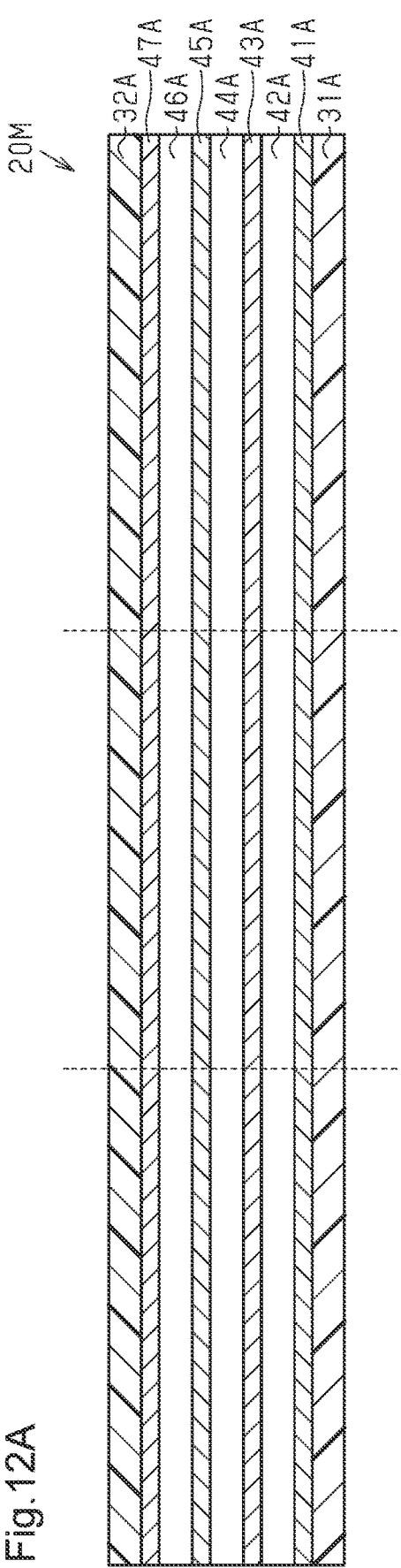
FIGS. 12A and 12B are schematic cross-sectional views illustrating a wiring substrate having a model structure used in simulations.

A model structure 20M used in the simulation will now be described with reference to FIGS. 12A and 12B. The condition of the insulation layers of the model structure 20M was changed so that the simulation was executed under four types of conditions, namely, first and second examples and first and second comparative examples. FIG. 12A illustrates the model structure 20M used in the first and second examples and the first and second comparative examples.

As illustrated in FIG. 12A, the model structure 20M used in the first and second examples and the first and second comparative examples has the same layer structure as the wiring substrate 20 illustrated in FIG. 1. That is, the model structure 20M has a layer structure obtained by sequentially stacking a solder resist layer 31A, a wiring layer 41A, an insulation layer 42A, a wiring layer 43A, an insulation layer 44A, a wiring layer 45A, an insulation layer 46A, a wiring layer 47A, and a solder resist layer 32A. In the model structure 20M, the wiring layer 41A is a solid pattern extending on the entire upper surface of the solder resist layer 31A. In the same manner, in the model structure 20M, the wiring layers 43A, 45A, and 47A are solid patterns extending on the entire upper surface of the insulation layers 42A, 44A, and 46A, respectively. In the model structure 20M, the thickness of the solder resist layers 31A and 32A is 25 μm, the thickness of the wiring layers 41A, 43A, 45A, and 47A is 12 μm, and the thickness of the insulation layers 42A, 44A, and 46A is 25 μm.

Figure 12B:
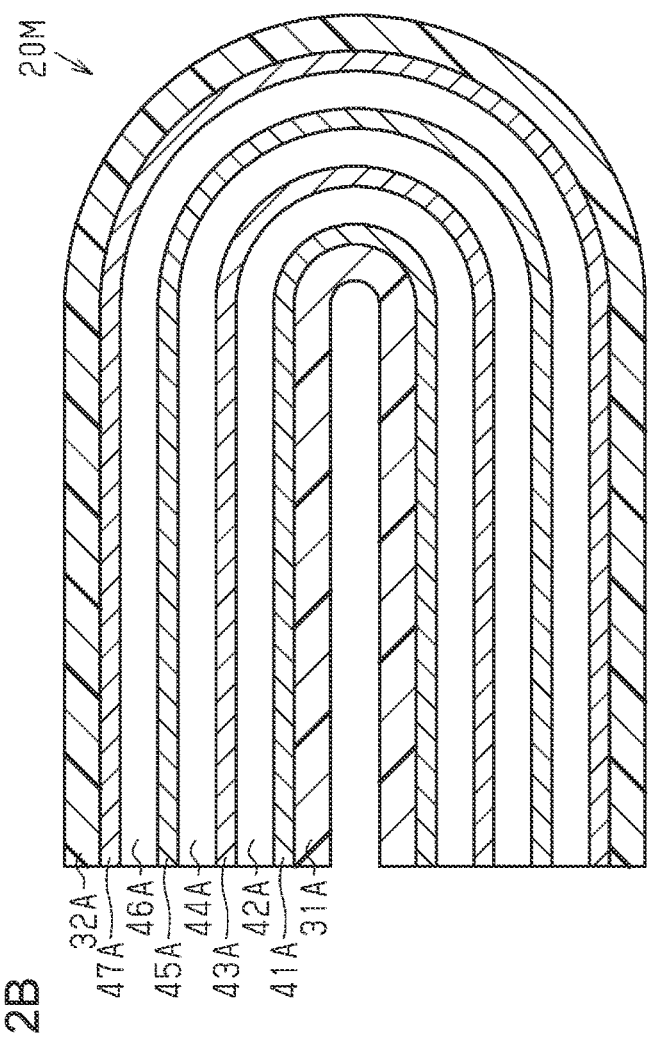

As illustrated in FIG. 12B, in the present simulation, stress that would be produced on the solder resist layer 32A was simulated when the model structure 20M was bent to be U-shaped so that the radius of curvature became 0.35 mm. The model structure 20M is bent so that the solder resist layer 31A is disposed at the inner bent position of the bent part and that the solder resist layer 32A is disposed at the outer bent position of the bent part.

The first and second examples and the first and second comparative examples differ from each other in only the combination of resins forming the insulation layers 42A, 44A, and 46A. That is, all of the elements (conditions) except for the combination of resins forming the insulation layers 42A, 44A, and 46A are set to be the same for the first and second examples and the first and second comparative examples. In the following description, only the insulation layers 42A, 44A, 46A of each example will be described.

As illustrated in FIG. 13, in the first example, the insulation layer 42A is formed from resin A, and the insulation layers 44A and 46A are formed from resin B. Resin A has a higher elastic modulus than resin B. That is, in the first example, the insulation layer 42A located at the inner bent position is formed from resin A having a high elastic modulus, and the insulation layers 44A and 46A located at the outer bent positions relative to the insulation layer 42A are formed from resin B having a low elastic modulus. In other words, the combination of resins forming the insulation layers 42A, 44A, and 46A in the first example is the same as the combination of resins forming the insulation layers 42, 44, and 46 of the wiring substrate 20 illustrated in FIG. 1.

In the second example, the insulation layers 42A and 44A are formed from resin A, and the insulation layer 46A is formed from resin B. In other words, the combination of resins forming the insulation layers 42A, 44A, and 46A in the second example is the same as the combination of resins forming the insulation layers 42, 44, and 46 of the modified example illustrated in FIG. 8.

In the first comparative example, all of the insulation layers 42A, 44A, and 46A are formed from resin A. In the second comparative example, all of the insulation layers 42A, 44A, and 46A are formed from resin B.

In the first and second examples and the first and second comparative examples, the flexural modulus of the model structure 20M was simulated. Also, in the first and second examples and the first and second comparative examples, stress that would be produced in the outer bent position (the solder resist layer 32A) when the model structure 20M was U-shaped as illustrated in FIG. 12B was simulated. FIG. 13 illustrates the simulation results.

Simulation Result

As illustrated in FIG. 13, in the second comparative example, in which all of the insulation layers 42A, 44A, and 46A were formed from resin B having a low elastic modulus, the flexural modulus of the model structure 20M was low. Thus, a favorable flexural modulus was obtained. However, in the second comparative example, stress was increased at the outer bent position and caused deformation such as breakage at the outer bent position. The cause of the deformation may have been strains that were formed at the inner bent position by compressive stress at the time of bending because the insulation layer 42A located at the inner bent position was formed from the low elastic modulus resin B. When strains are formed at the inner bent position, stress will concentrate on a particular part in the outer bent position in accordance with the strains. This increases stress at the outer bent position and forms breakage at the outer bent position.

In contrast, in the first comparative example, in which all of the insulation layers 42A, 44A, and 46A were formed from the high elastic modulus resin A, the flexural modulus of the model structure 20M was increased, and a desired flexural modulus was not obtained. In the first comparative example, the model structure 20M could not be bent to have a desired radius of curvature.

In the first and second examples, the flexural modulus of the model structure 20M was decreased as compared to in the first comparative example. That is, in the first and second examples, a desired flexural modulus was obtained. This may be because among the insulation layers 42A, 44A, and 46A, at least the insulation layer 46A was formed from the low elastic modulus resin B. In the first and second examples, the model structure 20M was appropriately bent to have a desired radius of curvature. In the first and second examples, stress at the outer bent position was decreased as compared to in the second comparative example. This may be because deformation such as strain at the inner bent position caused by compressive stress at the time of bending was limited by the insulation layer 42A located at the inner bent position and formed from the high elastic modulus resin A. Thus, in the first and second examples, breakage at the outer bent position was appropriately limited.

In addition, when the insulation layer 44A was formed from the low elastic modulus resin B as in the first example, the decreasing degree of the flexural modulus and the decreasing degree of stress at the outer bent portion were greater than when the insulation layer 44A was formed from the high elastic modulus resin A as in the second example.

Thus, when the insulation layer 42A located at the inner bent position is formed from the high elastic modulus resin A and the insulation layer 46A located at the outer bent position is formed from the low elastic modulus resin B, stress at the outer bent position is decreased while decreasing the flexural modulus. In addition, when the insulation layer 44A located between the insulation layer 42A and the insulation layer 46A is formed from the low elastic modulus resin B, both the flexural modulus of the model structure 20M and the stress at the outer bent position are decreased effectively.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:
   a bendable portion including one or more wiring layers and insulation layers, the one or more wiring layers being alternately stacked with the insulation layers, wherein the insulation layers of the bendable portion include:
      a first insulation layer that is located at an inner bent position of the bendable portion when the bendable portion is bent;
      a second insulation layer that is located at an outer bent position of the bendable portion relative to the first insulation layer when the bendable portion is bent; and
      a third insulation layer disposed between the first insulation layer and the second insulation layer in a stacking direction of the wiring substrate,
   the first insulation layer has an elastic modulus that is higher than that of the second insulation layer,
   the third insulation layer has an elastic modulus that is lower than the elastic modulus of the first insulation layer,
   wherein the one or more wiring layers of the bendable portion include:
      a first wiring layer covered by the first insulation layer;
      a second wiring layer stacked on the first insulation layer and electrically connected to the first wiring layer, the second wiring layer being covered by the third insulation layer stacked on the first insulation layer;
      a third wiring layer stacked on the third insulation layer and electrically connected to the second wiring layer, the third wiring layer being covered by the second insulation layer stacked on the third insulation layer; and
      a fourth wiring layer stacked on the second insulation layer and electrically connected to the third wiring layer,
   the third wiring layer of the bendable portion is greater in area than the first wiring layer of the bendable portion and greater in area than the fourth wiring layer of the bendable portion.

2. The wiring substrate according to claim 1, wherein the first insulation layer is located at an innermost bent position of the bendable portion among the insulation layers, and the second insulation layer is located at an outermost bent position of the bendable portion among the insulation layers.

3. The wiring substrate according to claim 1, further comprising:
   a mount portion for an electronic component, the mount portion being disposed adjacent to the bendable portion and including the one or more wiring layers and the insulation layers,
   wherein the mount portion includes a via wiring connected to the one or more wiring layers, and the bendable portion is free of the via wiring.

4. The wiring substrate according to claim 1, wherein the elastic modulus of the third insulation layer is higher than the elastic modulus of the second insulation layer.

5. The wiring substrate according to claim 1, wherein the second wiring layer of the bendable portion is greater in area than the first wiring layer of the bendable portion and greater in area than the fourth wiring layer of the bendable portion.

6. The wiring substrate according to claim 1, further comprising:
   a protective insulation layer stacked on the second insulation layer and covering the fourth wiring layer,
   wherein the protective insulation layer has an elastic modulus that is lower than the elastic modulus of the first insulation layer.

7. The wiring substrate according to claim 2, further comprising:
   a protective insulation layer stacked on the second insulation layer, wherein the protective insulation layer has an elastic modulus that is lower than the elastic modulus of the first insulation layer.

8. A semiconductor device, comprising:
   the wiring substrate according to claim 1; and
   an electronic component mounted on the wiring substrate.

* * * * *